United States Patent [19]

Belcher

[11] Patent Number: 4,890,106

[45] Date of Patent: Dec. 26, 1989

[54] APPARATUS AND METHODS FOR DIGITAL-TO-ANALOG CONVERSION USING MODIFIED LSB SWITCHING

[75] Inventor: R. Allan Belcher, Swansea, United Kingdom

[73] Assignee: Burr-Brown Corporation, Tucson, Ariz.

[21] Appl. No.: 108,583

[22] Filed: Oct. 13, 1987

Related U.S. Application Data

[60] Division of Ser. No. 891,785, Jul. 30, 1986, Pat. No. 4,703,308, which is a division of Ser. No. 633,092, Jul. 23, 1984, Pat. No. 4,621,254, which is a continuation-in-part of Ser. No. 630,977, Jul. 16, 1984.

[30] Foreign Application Priority Data

Jul. 29, 1983 [GB] United Kingdom ............... 8320534

[51] Int. Cl.$^4$ ............................................. H03M 1/66
[52] U.S. Cl. .................................... 341/144; 341/145
[58] Field of Search ................ 341/131, 118, 144, 145

[56] References Cited

U.S. PATENT DOCUMENTS 4,006,475  2/1977  Candy et al. ...................... 341/145
4,109,110  8/1978  Gingell .............................. 341/126

*Primary Examiner*—William M. Shoop, Jr.
*Assistant Examiner*—Helen Kim
*Attorney, Agent, or Firm*—Cahill, Sutton & Thomas

[57] ABSTRACT

A method and apparatus for converting a plurality of digital signals to an analog signal and m-bit digital-to-analog converter having an LSB current switch. A most significant m bits of an m bit digital signal are applied to m bits, respectively, of the m bit digital-to-analog converter, and successive values of the n bit digital signal are substituted at a first frequency. An interpolation signal is produced at the first frequency. A least significant n−m bits of the n bit digital signal are applied to the interpolation circuit to cause it to interpolate between successive values of the n bit digital signal. An LSB current switch distinct from the m bit digital-to-analog converter produces an output signal in response to the interpolation signal. An analog output signal produced by the m bit digital-to-analog converter is combined with the output signal produced by the LSB current switch to produce an analog output signal with n bit resolution. The least significant n−m bits are applied to the inputs of an n−m bit up/down counter, causing it to count up or down from the digital value of the least significant n−m bits at a second frequency that is $2^{n-m}$ times the first frequency to thereby produce the interpolation signal on a carry output of the up/down counter. The settling times of the analog output signal occurring at the first frequency are thereby limited to the settling times of the output signal of the LSB current switch.

5 Claims, 4 Drawing Sheets

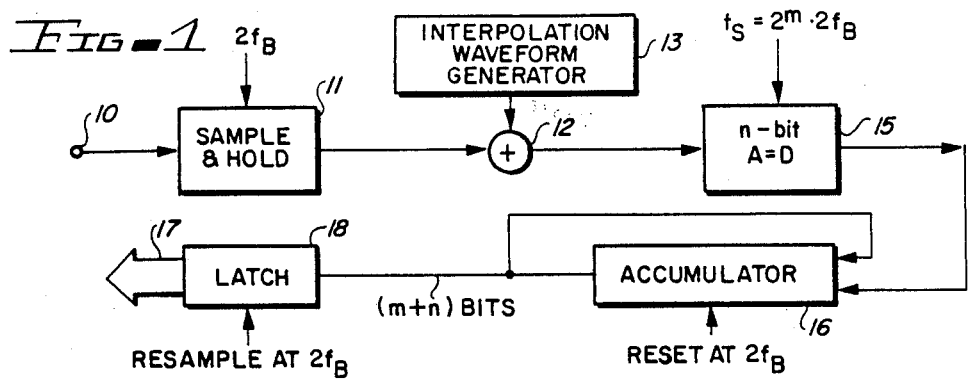
FIG-1
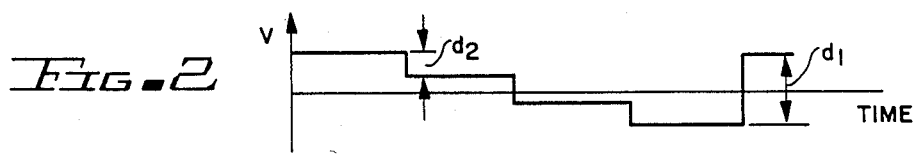
FIG-2
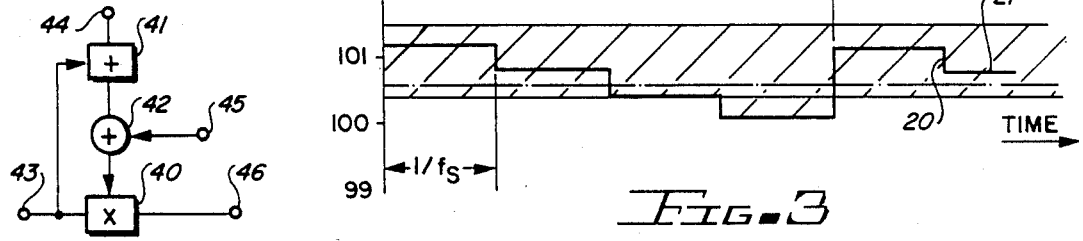
FIG-3
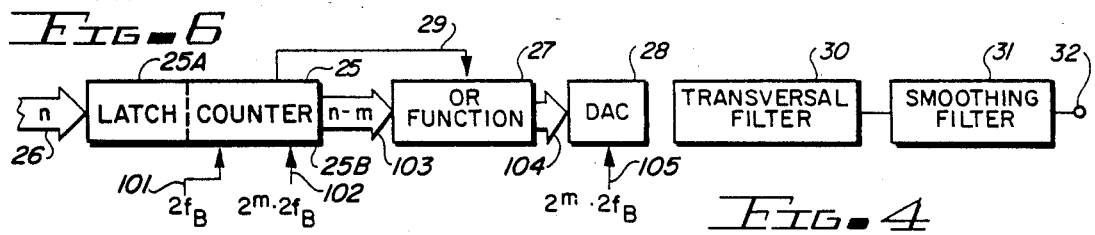
FIG-4
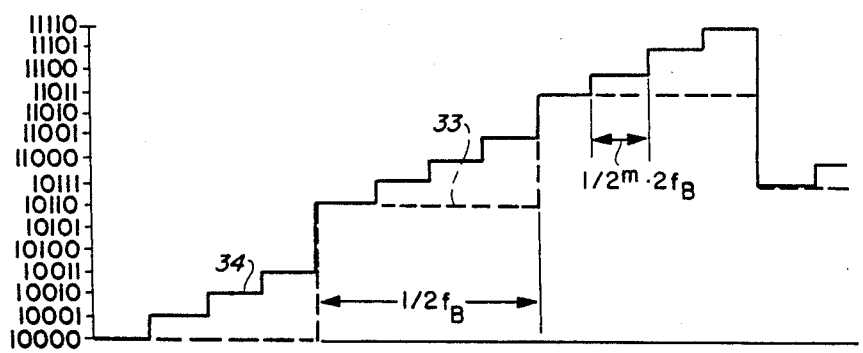
FIG-5

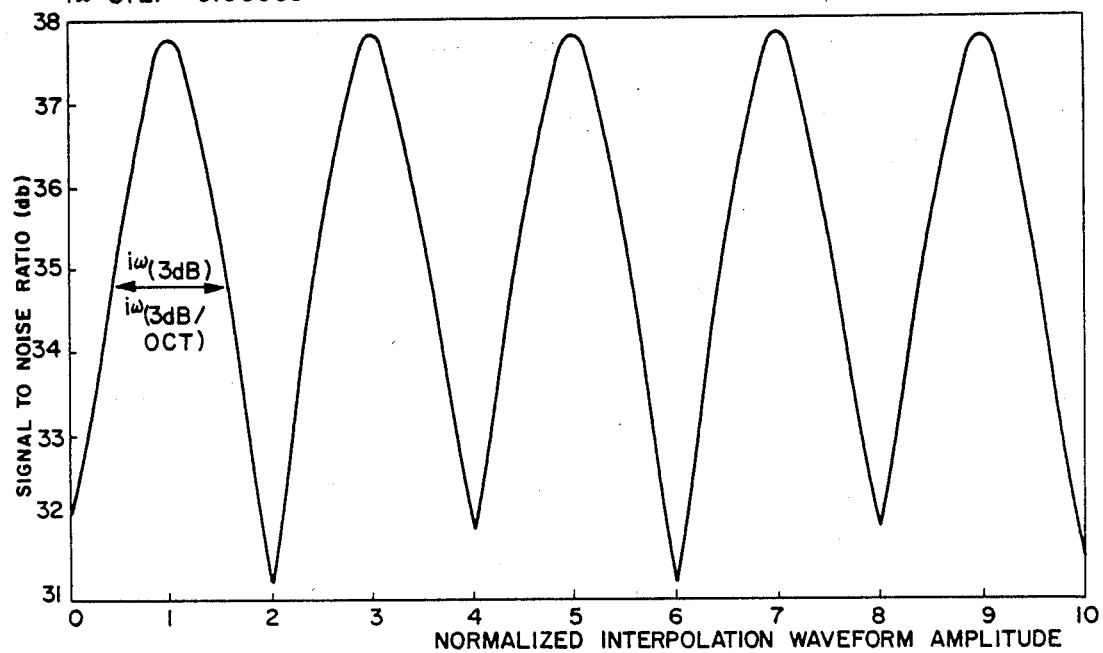
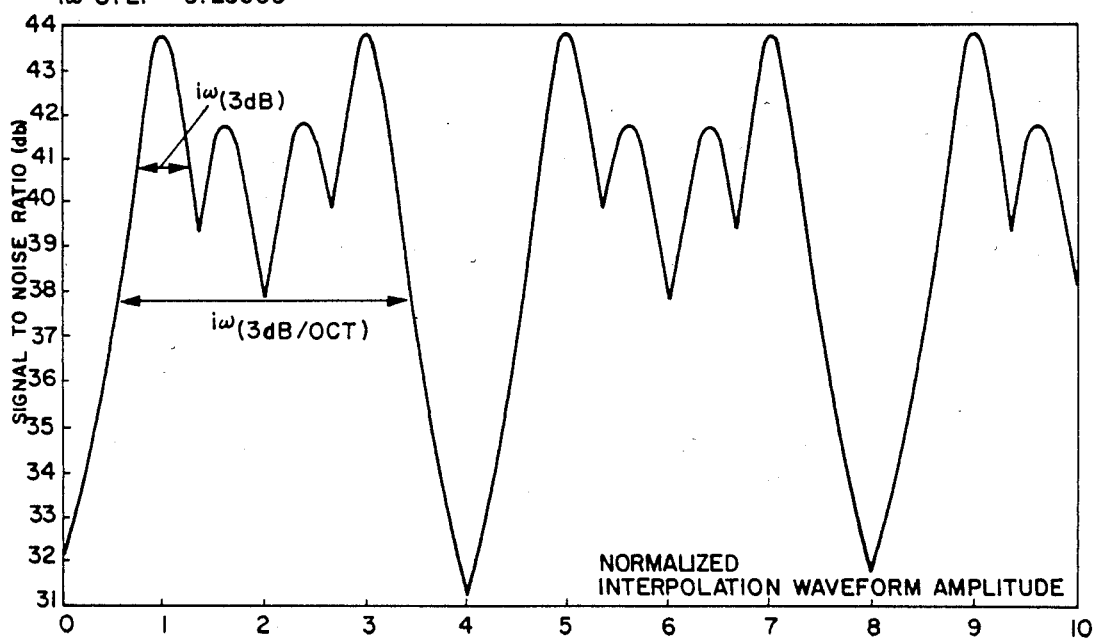

APPARATUS AND METHODS FOR DIGITAL-TO-ANALOG CONVERSION USING MODIFIED LSB SWITCHING

CROSS-REFERENCE TO RELATED APPLICATION

This application is a division of application Ser. No. 891,785 filed July 30, 1986, now U.S. Pat. No. 4,703,308, which is a division of application Ser. No. 633,092 filed July 23, 1984, now U.S. Pat. No. 4,621,254, which is a continuation-in-part of application Ser. No. 630,977 filed July 16, 1984, claiming priority based on United Kingdom patent application Serial No. 8320534 filed July 29, 1983 entitled "Apparatus And Methods For Analogue-To-Digital And Digital-To-Analogue conversion".

The present invention relates to apparatus and methods for analogue-to-digital (A-to-D) and digital-to-analogue (D-to-A) conversion.

The quantising accuracy of A-to-D and D-to-A converters is, in general, limited by the accuracy to which electronic components can be manufactured or the speed at which electronic switches can operate. The term converter is used in this specification when a reference is made to either type of converter.

A speed times accuracy product can be found which applies to each method of conversion and provides a performance indicator. This indicator is of most importance in monolithic circuit versions of converters. For example, one method such as the 'flash' technique of analogue-to-digital conversion can produce a quantised output in a very short time and is probably the fastest conversion method. The quantising accuracy is at the moment, however, limited to at most 8 binary digits (bits) because a potential divider is required to generate reference voltages for the $(2^8-1)$ comparators required, and with present integrated circuit technology the potential divider cannot be manufactured easily with an accuracy or stability greater than that needed for 8 bit conversion. Techniques such as laser trimming or 'zener zapping' can be used to trim the potential divider to greater accuracy, and this could extend the quantising accuracy to 12 bits, though at increased production cost.

The limiting factor with integrated circuit 'flash' converters is the number of comparators which can be accommodated in a high-speed integrated circuit within an economic die size, and this limits the quantising accuracy to about 10 bits at present. The maximum sampling frequency of a 'flash' 10 bit converter is in the region of 20 MHz, whereas the sampling frequency of a 1 bit converter can be as much as 500 MHz. Converters with a quantising accuracy of 16 bits are at present limited to sampling frequencies in the region of 50 KHz.

This higher accuracy can be obtained by using inherently slow-speed conversion techniques (e.g. the dual-slope ramp-converter) which do not depend on high accuracy resistor networks.

The practical constraints of integrated circuit technology therefore enable low quantitising distortion (up to 16 bits) to be achieved but at a low sampling frequency. Alternatively, a very high sampling frequency can be obtained if high quantising distortion (1 bit) is acceptable.

Oversampling is a well known technique for trading speed for accuracy, in which sampling is carried out at a frequency which is higher than the Nyquist frequency.

The r.m.s. sinewave signal to r.m.s. quantising noise ratio in a bandwidth $f_B$ produced by an n bit A-to-D converter at a sampling rate of $2f_B$ is equal to $(6n+1.8)$dB. If the sampling frequency is greater than the Nyquist ($2f_B$) frequency, then the noise within the baseband up to $f_B$ is reduced. Every time the sampling frequency is doubled the quantising noise power in the baseband up to $f_B$ is reduced by 3 dB. It can be seen that a fourfold increase in sampling frequency is necessary to reduce the baseband noise by 6 dB: equivalent to that given by an analogue-to-digital converter of 1 bit greater accuracy, sampled at the Nyquist rate.

Another problem which occurs in A-to-D and D-to-A converters is that of providing equally spaced quantising levels. Due to component tolerances such converters usually have some degree of non-uniformity in this respect.

According to a first aspect of the present invention there is provided apparatus for digital-to-analogue or analogue-to-digital conversion comprising holding means for holding values of a signal to be converted one at a time, successive values being substituted at a first frequency, combining means for combining the output signal of the holding means, with an interpolation signal which is periodic at the first frequency or a multiple thereof, a digital-to-analogue or analogue-to-digital converter, connected to the addition means, and arranged to operate at a second frequency which is p times the first frequency where p is greater than one, the converter having a quantising interval $d_1$ which is no more than $$\left[\frac{p}{2}\left(1 - \frac{2p - \log_2 p}{2p + 1}\right)\right]^{-1}$$

times the magnitude of the change effected by the combining means on the output signal of the holding means in one period of the interpolation signal, and averaging means for averaging the output of the converter.

The combining means may comprise addition means for adding the interpolation signal to the output signal of the holding means, the interpolation signal having a maximum excursion which is at least $$\frac{p}{2}\left(1 - \frac{2p - \log_2 P}{2p + 1}\right)$$

times the interval $d_1$. Since subtraction is the addition of a negative number, the word "addition" as used in the claims of this specification includes subtraction. Alternatively the combining means may comprise means for multiplying or dividing the output signal of the holding means by a multiplier or divisor which varies periodically at the first frequency or a multiple thereof to provide the required change in magnitude.

An important advantage of the present invention as applied to binary A-to-D converters is that where the converter used has an accuracy when sampling at the second frequency of, for example, n bits, the accuracy of the output obtained from the apparatus according to the invention is (m+n) bits where p equals $2^m$. In D-to- A conversion if the converter has an accuracy of (n−m) bits when operating at the second frequency there are more steps in its output signal per unit time than would be available by using an n bit converter at a necessarily slower rate. A "smoother" output analogue signal can be obtained by averaging a converter output if the converter output has more output steps per unit time.

For optimum increase in signal to quantising noise ratio the said maximum excursion should be less than the quantising interval of the converter. However the above-mentioned problem of non-uniformity in quantising levels can be lessened by employing a maximum excursion which spans several quantising intervals. Such improvement is at the expense of the speed times accuracy product since as the signal at the first frequency has a greater excursion, more time is required to cover this excursion and convert the signal so provided to a digital or an analogue output.

In some circumstances p need not equal a power of two since where quantisation in the converter is not binary other integer (or even non-integer) values of p may be found useful. Further, at the expense of the speed times accuracy product, the signal which is added by the addition means may be periodic at a multiple of the first frequency.

When the apparatus is for binary A-to-D conversion, the holding means may comprise a sample-and-hold circuit operating at the first frequency. The combining means may add a sawtooth waveform having a repetition frequency equal to the first frequency and the combining means then includes a further sample-and-hold circuit operating at the second frequency for generating samples of the signals formed by addition for application to the converter. Alternatively the combining means may add a stepped waveform, having a repetition frequency equal to the first frequency and steps of duration equal to the period of the second frequency. Each step may have a magnitude equal to the said maximum excursion of the periodic signal divided by the number of step transitions. The averaging means may comprise an accumulator circuit arranged to be reset at the first frequency.

In D-to-A conversion the said quantising interval is the difference between the magnitudes of adjacent levels in the analogue output before significant smoothing takes place.

Where the apparatus is a D-to-A converter, the holding means and the addition means together may comprise an up/down counter which is arranged both to be reset at the first frequency to values of the input for conversion and to be incremented or decremented at the second frequency in each period of the first frequency.

The D-to-A converter may be capable of converting binary signals having q bits where q is less than the number of bits in the output of the up/down counter, only the q most significant bits being passed from the counter to the converter. The averaging means may be a low pass filter having a cut-off frequency at the top of the desired bandwidth for output signals.

According to a second aspect of the present invention there is provided a method of digital-to-analogue or analogue-to-digital conversion comprising the steps of holding values of a signal to be converted, one at a time and substituting successive values of the signal at a first frequency, combining an interpolation signal which is periodic at the first frequency or a multiple thereof with each signal value held, to generate a resultant signal, carrying out a digital-to-analogue or analogue-to-digital conversion on each resultant signal at a second frequency which is p times the first frequency, the conversion being carried out using a quantising interval $d_1$ which is no more than $$\frac{p}{2}\left(1 - \frac{2p - \log_2 p}{2p + 1}\right)$$

times the magnitude of the change effected in one period of the interpolation signal by combining the interpolation signal with one of the signal values held, and averaging the output from the converter.

A method and apparatus for converting a plurality of digital signals to an analog signal and m-bit digital-to-analog converter having an LSB current switch. A most significant m bits of an m bit digital signal are applied to m-bits, respectively, of the m bit digital-to-analog converter, and successive values of the n bit digital signal are substituted at a first frequency. An interpolation signal is produced at the first frequency. A least significant n−m bits of the n bit digital signal are applied to the interpolation circuit to cause it to interpolate between successive values of the n bit digital signal. An LSB current switch distinct from the m bit digital-to-analog converter produces an output signal in response to the interpolation signal. An analog output signal produced by the m bit digital-to-analog converter is combined with the output signal produced by the LSB current switch to produce an analog output signal with n bit resolution. The interpolation circuit includes an n−m bit up/down counter. The least significant n−m bits are applied to the inputs thereof, causing the up/down counter to count up or down from the digital value of the least significant n−m bits at a second frequency that is $2^{n-m}$ times the first frequency to thereby produce the interpolation signal on a carry output of the up/down counter. The settling times of the analog output signal occurring at the first frequency are thereby limited to the settling times of the output signal of the LSB current switch.

Certain embodiments of the invention will now be described by way of example with reference to the accompanying drawings in which:

FIG. 1 is a block diagram of A-to-D conversion apparatus according to the invention, FIG. 2 shows an interpolation waveform for use in A-to-D conversion, FIG. 3 is a diagram illustrating the way in which averaging takes place in the circuit of FIG. 1, FIG. 4 is a block diagram of a D-to-A conversion apparatus according to the invention, FIG. 5 is a diagram illustrating the effect of incrementing the up/down converter of FIG. 4, and FIG. 6 is a block diagram of a circuit which may be used as an alternative to part of FIG. 1.

FIGS. 7 to 10 illustrate interpolation waveforms.

Figure 9:
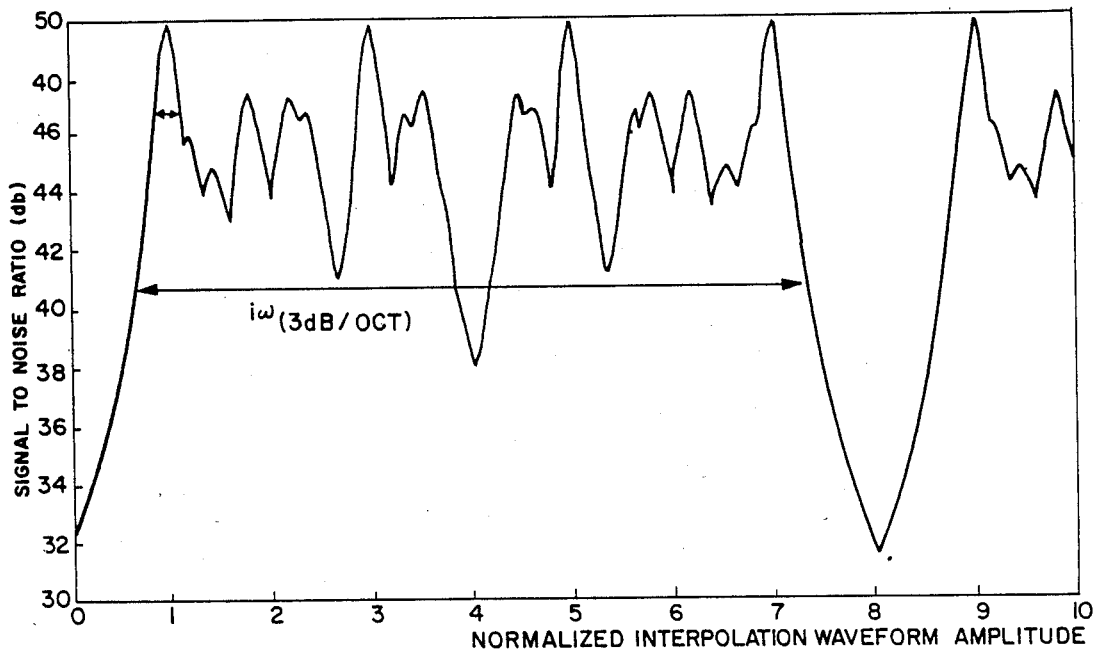
Figure 10:
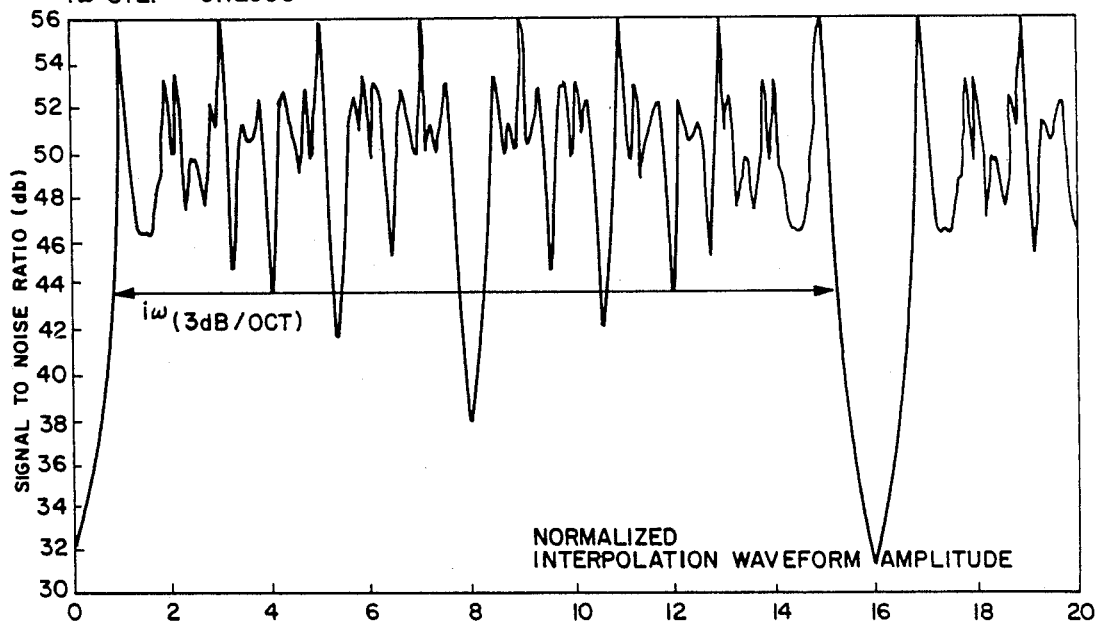

In the A to D converter apparatus of FIG. 1 an input waveform to be digitized is applied to a terminal 10 and thence to a sample-and-hold circuit 11 sampling at a frequency $2f_B$ where $f_B$ is the input bandwidth of the incoming signal. By means of an addition circuit 12 a signal from an interpolation waveform generator 13 is added to the output of the sample-and-hold circuit 11.

One form of interpolation waveform is shown in FIG. 2. It has a period of $\frac{1}{2}f_B$ and decreases in steps $d_2$ at the ends of periods $1/f_S$. The frequency $f_S$ is the frequency of conversion in an A-to-D converter 15, and flyback to the initial magnitude of the interpolation waveform occurs at the end of each period $1/(2f_B)$. The frequency $f_S = 2^m \cdot 2f_B$ and therefore there are $2^m - 1$ step transitions in the interpolation waveform excluding flyback.

For binary conversion, the maximum excursion of the interpolation waveform should, at least, equal a magnitude $d_1 \cdot (2^m - 1)/2^m$ where $d_1$ is the quantising interval of the converter 15. In the example shown the maximum excursion is equal to $d_1$, and $d_2 = d_1/3$ since there are three step transitions in each cycle of the interpolation waveform (again excluding flyback).

The output of the A-to-D converter 15 contains $2^m$ samples for each sample at the output of the circuit 11 and this increased number of samples is averaged by means of a resettable accumulator 16 which is reset at intervals of $\frac{1}{2}f_B$. As a result the output of the accumulator 16 contains m+n bits. The accumulator adds together the values presented at its two inputs to produce a running sum. Each new input is added to the previous sum provided by way of the feedback path shown.

In order to give an (m+n) bit pcm parallel output while the accumulator 16 is operating, it is connected to a parallel output channel 17 by way of an output latch circuit 18 sampled at $2f_B$. The latch circuit holds the result produced by the accumulator 16 over a period $\frac{1}{2}f_B$ when the accumulator is reset and a new value is derived.

Another interpolation waveform which may be used is a sawtooth waveform having a maximum excursion of $d_1$ and an average d.c. value of zero. A further sample-and-hold circuit (not shown), sampling at $2^m \cdot 2f_B$, is then connected between the addition circuit 12 and the converter 15. In view of the use of the further sample-and-hold circuit the maximum excursion $d_1$ cannot be reduced to $$\frac{2^m - 1}{2^m} \cdot d_1$$

as for the stepped interpolation waveform. Either of the two previously mentioned waveforms may be used when modified to have a d.c. value equal to $\pm d_1/2$, and either may increase progressively with time, rather than decreasing.

A triangle waveform is another suitable interpolation waveform.

An input low-pass anti-aliasing filter (not shown) of bandwidth $f_B$ is connected at the input terminal 10 since a filter of this type is a requirement of all sampled systems.

An example of the operation of the apparatus of FIG. 1 is now given. In FIG. 3 one output level from the sample-and-hold circuit 11 over the period $\frac{1}{2}f_B$ is shown by a chain dotted line 20. The vertical axis is divided according to decimal code corresponding to magnitude of input level to the converter 15. Only a portion of the axis is shown over the interval 99 to 103. In a conventional A-to-D converter the output code corresponding to a given magnitude is given for any input amplitude within $\pm \frac{1}{2}$ a quantising interval of that magnitude; for example any magnitude in the interval 100.5 to 101.5, that is within the shaded area of FIG. 3, receives the output code 101. Thus the level 20 corresponds to an output level 101 from the converter 15 but in fact the level could be said to be 100.67 (say). When the interpolation waveform is added the resultant is as shown by the continuous line 21 and the samples obtained at the rate $f_S$ are 101, 101, 101, 100 and when these samples are averaged by the accumulator 16 the result 100.75 is provided and an increase in accuracy of 2 bits is obtained. In this example since there are (4−1) steps in the quantising signal $2^m = 4$ and $m = 2$.

As has already been mentioned at present 16 bit converters operating at 50 KHz and 10 bit converters operating at 20 MHz are, for example, obtainable. If $2f_B$ is 50 KHz then a 16 bit output can be obtained without using the invention or oversampling using the first of these converters. By oversampling at 200 KHz (not using the invention) a 1 bit increase in accuracy to 17 bits could be obtained if this were possible. On the other hand by using the invention with a 10 bit converter which samples at 20 MHz, m is between 8 and 9 and therefore the accuracy is n+m=18 or 19 bits.

An alternative way of combining the output of the sample-and-hold circuit 11 with the output of the generator 13 is to replace the addition circuit 12 of FIG. 1 with the circuit of FIG. 6 which employs a multiplier circuit 40, a divider circuit 41 and an addition circuit 42. The output $V_w$ of the sample-and-hold circuit 11 and the output $V_i$ of the interpolation waveform generator 13 are applied to terminals 43 and 44, respectively. The divider circuit 41 provides an output $V_i/V_w$ to which one is added by the circuit 42 which has unity input at a terminal 45. On multiplication by $V_w$ in the multiplier 40, the output $(V_i/V_w + 1)$ of the circuit 42 is converted to $V_i + V_w$ and appears at a terminal 46 for application to the A-D converter 15.

The divider circuit 41 may be formed, according to a known technique, by a multiplier using a negative feedback loop.

The D-to-A converter of FIG. 4 is now described. An up/down counter 25 includes an n-bit input latch section 25A which receives an n bit pcm signal by way of a parallel input channel 26. Up/down counter 25 also includes an n-bit counter section 25B. The inputs of counter section 25B sample the outputs of the latch section 25A at a sample rate $2f_B$ by a sample signal 101. The sample rate is determined by sample signal 101 having the frequency $2f_b$. The up/down counter section 25B is set by signal 101 at intervals $\frac{1}{2}f_B$ to the current value of the n bit pcm and it is counted up by one bit at a frequency of $2^m \cdot 2f_B$ so that there are $2^m$ times more samples in a given time at the output 103 of the counter 25 than at its input.

These samples are passed to an OR function circuit 27 at the rate $2^m \cdot 2f_B$ but only the n−m most significant bits are passed by conductors 104 to the OR function OR circuit. The circuit 27 ensures that the reduced number of bits does not result in all zeros being passed on to a D-to-A converter 28 when as a result of counting up, the counter 25 resets with all zeros. For this purpose the "carry" output of the counter 25 is connected to an input of the OR function circuit 27. The circuit 27 comprises (n−m) OR gates each receiving one input from the counter 25 and another input from the carry output from the counter 25.

The D-to-A converter 28 operates at the frequency $2^m \cdot 2f_B$ in response to a conversion signal 105 and therefore has an output level rate $2^m$ times greater than would be obtained by applying the input at the channel 26 to a D-to-A converter operating at $2f_B$. The output from the converter 28 is applied to a transversal filter 30 which carries out signal averaging which is equivalent to that of the accumulator of FIG. 1. The transversal filter may have $2^m-1$ sections, each imparting a delay of $$\frac{1}{2^m \cdot 2f_B},$$

in series with the circuit input signal, and the outputs of each section taken to a common summing circuit whose output is sampled at $2f_B$. The tap coefficient for each summing-circuit input is unity. The output of such a filter, when used in the circuit of FIG. 4, is the same as that produced by an ideal n-bit D-to-A converter. A smoothing filter 31 is connected at the output of the filter 30 to complete the process of removing quantisation noise contained in the band above the frequency $f_B$. Alternatively, a single low-pass filter with a high degree of attenuation above the frequency $f_B$ can be used to smooth the output of the D-to-A converter 28.

An example of the operation of FIG. 4 will now be given. Suppose three samples of a 5-bit input signal are applied to channel 26 and the three samples have values 10000, 10110 and 11001 as shown in FIG. 5 by the dashed line 33. The states taken up by the counter 25 are then as shown by the solid line 34 so that after truncation to provide an (n−m) input for the converter 28 the following samples are provided in the interval in which the three original samples occurred:

100, 100, 100, 100, 101, 101, 110, 110, 110, 111, 111 and 111.

These signals are applied to the converter 28 and the resulting output signal has more changes per unit time than the original signal. A relatively smooth analogue output is therefore obtained from the filter 31. The outputs of the converter 28 are summed in groups of four ($2^m$) by the transversal filter 30 to give 10000, 10110 and 11001 for the samples mentioned above, and these are the values which a 5-bit converter would have provided.

To contrast the invention with the prior art, if a 16 bit D-to-A converter is available, then without using the invention one of $2^{16}$ output levels could be obtained at a rate of 50 KHz for smoothing. However, if a 10 bit converter which operates at 20 MHz is used according to the invention, n−m=10 and m is between 8 and 9. Thus $2^{10}$ possible output levels at a rate of 20 MHz are provided and after smoothing between $2^{18}$ and $2^{19}$ possible output levels are obtained at a rate of 50 KHz.

The up/down counter 23 may be connected to count down during each period of $\frac{1}{2}f_B$, but a d.c. offset then occurs in the output signal. This is unimportant for conversion of audio signals and can be removed, if required, by the use of a coupling capacitor.

USE OF $(2^{n-m}+r)$ LEVEL A to D AND D to A CONVERTERS

One feature of this conversion technique, is that a small loss of input dynamic range occurs when a $2^{n-m}$ level converter is employed in the system. Ideally, an n bit converter should provide outputs which correspond to $2^n$ different levels; with this system, some of these levels are lost because the $2^{n-m}$ level dynamic range must be used partly for the interpolation signal and partly for the main signal. If one l.s.b. of interpolation is used, then the number of levels which the main signal can excurse is $(2^{n-m}-1)$. This loss of range may be unimportant when, for example, n−m=16. In an integrated circuit implementation of this system, it would be advantageous to use a $(2^{m-n}+r)$ level converter, where r is small and equals the number of l.s.b's of interpolation used. This is preferable to using a $2^{m-n+1}$ level converter as (a) much less silicon area is needed, and (b) faster effective operation of the converter becomes possible by making use of the much reduced one l.s.b. conversion time as explained under increased performance using improved l.s.b. conversion times. It is instrumentally easier to achieve fast one l.s.b. conversion times in an r level converter where the r levels change one at a time than in a conventional binary converter (particularly for D to A conversion).

For example, a $(2^{m-n}+1)$ level flash A to D could be produced by adding only one extra comparator and a $2^{m-n}+1$ level binary weighted current D to A could be produced by adding an extra one l.s.b. current source. The r level part of the converter would be controlled separately from the $2^{m-n}$ level part. In the D to A application this separate control would reduce the amplitude of switching transients.

A conventional binary D to A is not optimum for obtaining minimum one l.s.b. conversion time as the worst case figure must be used and due to the m.s.b. switching transient, this occurs at the one l.s.b. code change of 01111 ... to 1000 ..., (a full scale conversion time would be measured with a code change of 0000 .. . to 1111 ... ). With conventional binary D/A converters, major bit transistors such as 01111 to 10000 can occur with an effective one l.s.b. change in signal level. The switching transients which correspond to these changes are at amplitudes near the m.s.b. level rather than the l.s.b. level. The extra r levels change only one l.s.b. at a time and any switching transients introduced are always smaller than those due to m.s.b. transitions. Additional control logic will be required in order to select the r level portion of the D/A converter. Many arrangements are possible, depending on the value of r, but in its simplest form, the carry output of the counter 25 can be used to select the extra l.s.b. when r=1.

SIMPLIFICATION OF D to A DIGITAL CIRCUITRY

Simplification of the counter circuit is also possible when a $2^{m-n}+1$ level D to A is used: instead of an n-bit counter, an n−m bit latch plus an m-bit counter can be used. The n−m most significant bits of the input word would go straight to the (n−m) binary input portion of the D/A. The m least significant bits of the n-bit input words would preset an m-bit up-counter, and the carry output of this counter would control the l.s.b. portion of the D/A. This approach can be extended to cover the r level case and offers a saving in logic circuitry and the possibility of faster circuit operation.

IMPROVING THE FIGURE OF MERIT OF DIGITAL TO ANALOGUE CONVERTERS BY USING INTERPOLATION

Indexing terms: digital to analogue conversion, interpolation An interpolative scheme is described which enables increased resolution to be obtained by utilizing the potentially fast settling time of one least significant bit (LSB) change in a digital to analogue converter (DAC). Results of experimental measurements indicate close to theoretical improvement is achievable in practice. The use of the arrangement in an integrated circuit design is likely to offer significant advantages in terms of lower production and testing costs than a conventional DAC of equivalent performance.

There is reported preliminary results of work aimed at improving the performance of an interpolative DAC. Interpolation achieves increased resolution from a DAC by alternately switching its output between adjacent levels. Time averaging of the DAC output using appropriate filtering can enable additional levels to be resolved between the DAC output levels and this has been likened to a process of linear interpolation. Previous work reported in this area has been aimed mainly at the development of integrated circuit codecs for speech transmission using companded pulse-code modulation. Maximum conversion speed and scope of this approach was limited by a need for relatively complex digital circuitry and a special purpose DAC which converted on a level-at-a-time basis. In contrast with this earlier work, this letter describes an arrangement which offers the promise of much higher conversion speeds and a wider field of application because very simple digital circuitry is used and the arrangement works with conventional DAC designs.

The definition of figure of merit of an analogue to digital converter as used in the specification is the resolution in bits multiplied by conversion frequency. For a digital to analogue converter the figure of merit is the product of its resolution in bits and the inverse of its full-scale settling time (bits×Hertz). Linear interpolation can be thought of as trading a reduction in effective conversion speed (Hertz) for an increase in effective resolution (bits), with no alteration in the figure of merit. The theoretical rate of exchange being therefore a one bit increase for every octave of speed reduction.

Whilst this exchange rate can be an attractive proposition for many applications, there are of course some in which the consequent increase in full-scale conversion time would be unacceptable. An arrangement is proposed which should enable a very much better rate of exchange to be obtained, resulting in an increase in the figure of merit.

Figure 11:
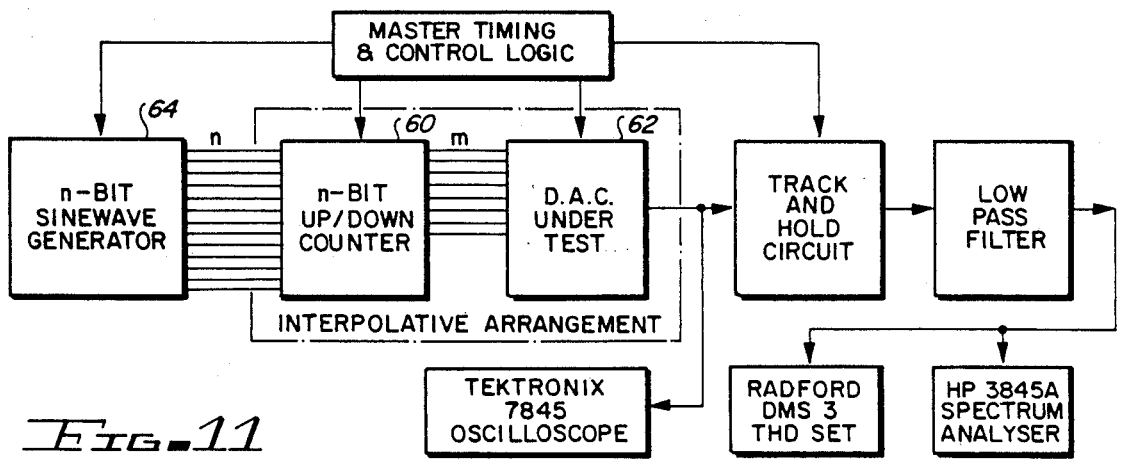
FIGS. 11 and 13 are block diagrams of modified arrangements.

Experiment: FIG. 11 shows the experimental arrangement. The digital circuitry required consists simply of a presettable up/down counter 60. In the experiment a commercially available 16 bit DAC 62 was used to examine the practical limits of the technique. The test signal source was a low distortion digital sinewave generator 64 which produced data words at a rate of 50,000 per second.

Experimental measurements were first made using only the eight most significant bits of the DAC in order to minimise the influence of DAC linearity errors and switching transients. This was followed by measurements using sinewave data which generated an output waveform of peak amplitude −40 dB relative to maximum available from the DAC, and centred on the mid scale point of the DAC. In this last test, all 16 data inputs of the DAC were used. Signal to quantising noise ratios were measured using a total harmonic distortion analyzer.

Figure 12:
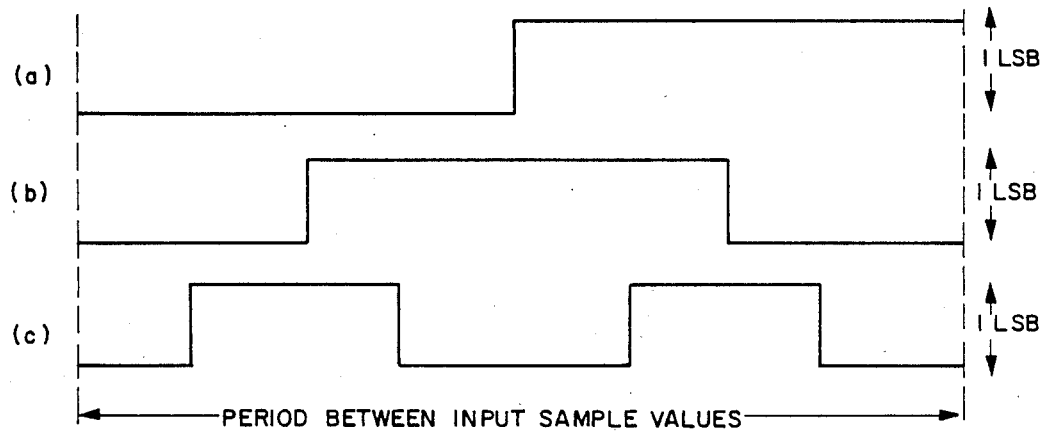
FIG. 12 shows interpolation waveforms using the arrangements of FIGS. 11 and 13.

Results: A computer program was written which used signal-flow graph theory to predict the likely improvement in baseband signal to quantising noise ratio and the amplitude-frequency distribution of the quantising noise. This analysis predicted a baseband improvement of 4.26 dB with interpolation waveform 1 shown in FIG. 12, 5.80 dB with waveform 2 in FIG. 12 and 5.99 dB with waveform 3 in FIG. 12 after the waveforms were low-pass filtered. Each of these waveforms has an average value of one half an LSB and in theory the use of an integrate and dump filter at the DAC output would enable the ideal figure of 6 dB improvement to be obtained with any of the waveforms. Practical measurements using the eight most significant bits of the DAC and a 20 kHz low-pass filter with a stop-band attenuation of better than 96 dB, gave signal to quantising noise ratio improvements of (a) 4.2 dB, (b) 5.8 dB, (c) 5.85 dB for waveforms 1, 2 and 3 respectively, showing very close agreement with the predicted values.

In the −40 dB test, signal to quantising noise ratios significantly worse than theoretical were obtained and investigations revealed that this was due primarily to switching transients (glitches) occuring when data inputs changed. The output data rate of the counter can be up to eight times more than its input rate and therefore the repetition frequency of the DAC transients can be up to 400 kHz. The importance of using a track-hold to remove such glitches is well recognised, particularly with DACs intended for digital audio.

In higher speed applications, this requirement for a fast track-hold may be undesirable as the design of such a device can present significant problems.

Figure of merit improvement: The minimum time between the n bit input words (conversion time) in the interpolative arrangement of FIG. 11 is simply the full scale settling time plus the time required for the sequence of LSB changes needed to produce the interpolation waveform. With most conventional DACs, the worst case LSB settling time is comparable with the full scale settling time owing to glitches which occur at input code changes. In practice, therefore, a figure of merit is calculated using a conversion time based on the full scale settling figure. The $2^m+1$ level DAC arrangement of FIG. 13, together with a simplified up/down counter system is suggested as a way of increasing the figure of merit available by using interpolation.

Figure 13:
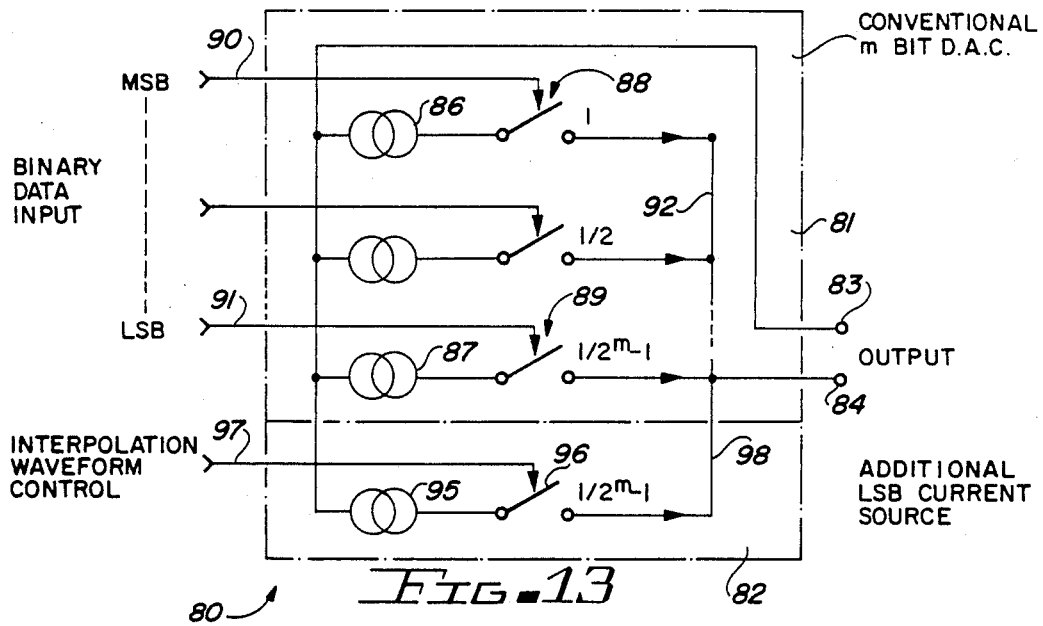

In FIG. 13, reference numeral 80 designates a small N-bit digital-to-analog converter which produces an analog output current on conductor 84. Conductor 83 is a ground conductor. Reference numeral 81 designates a conventional m-bit digital-to-analog converter. Its most significant bit (MSB) current source 86 and its corresponding most significant bit (MSB) switch 88 are schematically illustrated. MSB bit switch 88 is operated in response to the MSB bit of an n-bit binary input word to conductor 90. Similarly, the least significant bit of the n-bit word is applied to conductor 91 to control the LSB bit switch 89, which couples an LSB current source 87 to a current summation conductor 92, which is connected to output conductor 84.

Reference numeral 82 designates an "additional" LSB bit circuit that can be substantially identical to the LSB bit circuit including current source 87 and bit switch 89. Additional LSB circuit 82 includes bit switch 96, which is controlled in response to an interpolation waveform applied to conductor 97 from the output of the n−m stage presettable up/down counter mentioned below to switch an additional LSB current source 95 into conductor 98 so that that additional LSB current or output signal is combined with the outut signal produced on conductor 92 of m-bit DAC 81. In the proposed system, the m most significant bits of the n bit word are presented to the m bit conventional section of the DAC for the duration of the conversion period. The n−m least significant bits are loaded into an n−m stage presettable up/down counter and with the use of appropriate control signals the carry output of the counter provides the waveform to control the interpolation stage of the DAC. Glitches are now no worse a problem than with a conventional DAC as the interpolation stage is inherently glitch free. The settling time for the interpolation stage should therefore be very much less than the LSB settling time for the conventonal section of the DAC. This should reduce the total conversion time required significantly, with a corresponding increase in the figure of merit. Ideally the interpolation stage should be matched to the LSB stage of the conventional part of the DAC and therefore the proposed arrangement is likely to be of most use in an integrated circuit. The reduced complexity of the counter should facilitate faster operation at the integrated circuit level and reduce the area of silicon required.

Very good agreement has been obtained between theoretical predictions of signal to quantising noise ratios produced by an interpolative decoder and experimental measurements. Code-dependent switching transients have been found to be a major limitation to the application of interpolatve techniques to high speed digital to analogue conversion. In the light of this work a modified LSB switching arrangement has been proposed which would eliminate the switching transient problem at the LSB level. Owing to the much reduced LSB settling time, it would enable far better resolution to be obtained for a given full scale settling figure than previously reported interpolative arrangements. It is likely that the area of silicon required for the proposed interpolative DAC will be much less than for a conventional DAC with an equivalent resolution and full-scale settling time. In the limit, it is in principle possible to use an extremely fast low-resolution DAC to suit a wide range of lower-speed higher-resolution applications. An added advantage is that high-resolution conventional DACs ideally require time consuming level-at-a-time tests in order to fully characterise their performance. Because of this, full testing of high-resolution DACs in a production environment can be uneconomic. As the analogue section of an interpolative DAC is ideally of low resolution, full testing of this can be accomplished in a relatively short time and as the time required to test the remaining digital circuitry is insignificant it should prove economic to undertake full testing of interpolative DAC integrated circuits on a routine basis.

INCREASED PERFORMANCE USING IMPROVED L.S.B. CONVERSION TIMES

Most practical D to A and A to D converters are able to convert a signal change of one l.s.b. amplitude in less time than a signal change of full scale amplitude. All previous estimates of the improvements available using the method described in the patent specification have been based on only full scale conversion times as this is the conventional measure of conversion speed.

If the full scale conversion time is $T_L$ and the time available for conversion is $T_C(=\frac{1}{2}f_S)$ then the improvement in resolution would be $\log 2(T_C/T_L)$ bits.

By making use of the fact that the one l.s.b. conversion time is always less than the full scale conversion time, a further improvement in resolution can be obtained. In order to calculate this improvement, assume $T_C=2^m \cdot T_L$, $T_L=2^K \cdot T_S$, and $T_C=2^{m+K} \cdot T_S$, where $T_S$ is the one l.s.b. conversion time.

The first conversion must be able to cope with up to a full scale change and therefore the time remaining for l.s.b. conversions is $T_C-T_L$. An improvement of q bits more than can be obtained with just using $T_L$ is shown by the following equations.

$$q = \log_2\left(\frac{T_C - T_L}{T_S} + 1\right) - \log_2\frac{T_C}{T_L}$$
$$= \log_2(2^{m+K} - 2^K + 1)\,2^{-m}$$
$$= \log_2(2^K - 2^{K-m} + 2^{-m})$$

One conclusion which can be deduced from this equation is that if m is large, then it is possible to increase the resolution by up to K bits, giving a total improvement of almost m+K bits. In a given application it may be beneficial to increase the linearity of the converter at the expense of some of the m+K bits improvement in resolution.

INTERPOLATION WAVE FORM AMPLITUDE

The following information has been obtained on the amplitude of the interpolation wave form from the generator 13 in FIG. 1. This information has been obtained as a result of simulations with a 5 bit ideal quantizer. Neglecting the effect of over load:

| | |
|---|---|
| $iw^*$ | Ideal interpolation wareform amplitude / step size |
| $iw_{(3dB)}$ | Waveform range that gives ± 3dB SNR of the maximum. |
| $iw_{(3dB/Oct)}$ | Waveform range that gives better than 3dB/Octave improvement. |

Approximate amplitude ranges as a function of M=oversampling factor.

$$iw_{(3\,dB)} \stackrel{m}{=} \left(1 \pm \frac{1}{2^m}\right) iw^*$$

$$iw_{(3\,dB/Oct)} \stackrel{m}{=} 2^{m-1}\left(1 \pm \frac{2^{m+1} - m}{2^{N+1} + 1}\right) iw^* \quad \text{First Cycle}$$

These results are illustrated in FIGS. 7–10.

Now that embodiments of the invention have been described, it will be clear that the invention can be put into practice in many other ways. For a further increase in accuracy or better smoothing the present invention may be combined with the previously mentioned known apparatus and methods of oversampling.

An application of the improvement in resolution can be obtained by making use of a system which combines a fast one l.s.b. conversion with a conventional full scale conversion. The improvement available can be seen by way of the following example:

Using the prior art of oversampling, an 8 bit A to D converter with a full scale conversion time of 100 ns can be used to provide a 12 bit resolution conversion by averaging 256 successive full scale conversions, giving a total conversion time of 25,600 ns.

With the technique described above with reference to FIG. 1, 12 bit resolution could be obtained from the same A to D by using 32 successive full scale conversions, giving a total conversion time of 3,200 ns. In an A to D converter system which provides for both conversion of full scale signals and successive signals which are different in amplitude by only one l.s.b., two types of A to D converters are usually required. In this case, a one l.s.b. conversion may typically be completed in one tenth of the time for a full scale conversion. By making use of this faster one l.s.b. conversion in the present example, 12 bit resolution could be obtained by making one full scale 8 bit conversion (in 100 ns) followed by 31 successive one l.s.b. conversions (each taking 10 ns). The total conversion time is now reduced to 410 ns demonstrating a significant improvement in conversion speed over both prior art and the previous specification. If, instead of reducing the conversion time, the aim were to obtain the maximum resolution for a given conversion time (e.g., 25,600 ns), then this comparison would give the following results: using prior art oversampling techniques, 12 bits; using the technique in the circuit described above with reference to FIG. 1, 16 bits; using the technique described in the foregoing paragraph, 19 bits.

I claim:

1. A method for converting a plurality of digital signals to an analog signal, the method comprising the steps of:
    (a) applying a most significant m bits of an n-bit digital signal to be converted, to m bits, respectively, of an m-bit digital-to-analog converter having an LSB current switch circuit, and substituting successive values of the n-bit digital signal at a first frequency;
    (b) applying a least significant n−m bits of the n-bit digital signal to an interpolation circuit to produce an interpolation signal of the first frequency;
    (c) applying the interpolation signal to an input of an LSB current switch circuit additional to the LSB current switch circuit of the m-bit digital-to-analog converter; and
    (d) combining an analog output signal produced by the m-bit digital-to-analog converter with an output signal produced by the LSB current switch circuit to produce an analog output signal with n-bit resolution.

2. The method of claim 1 further including the step of filtering the analog output signal.

3. The method of claim 1 wherein step (b) includes applying the least significant n−m bits to an n−m bit up/down counter and operating the up/down counter to count up or down from the digital value of the least significant n−m bits at a second frequency that is $2^{n-m}$ times the first frequency to thereby produce the interpolation signal on a carry output of the up/down counter, to thereby limit settling times of the analog output signal occurring at the first frequency to the settling times of the output signal of the LSB current switch circuit.

4. A digital-to-analog conversion device comprising in combination:
    (a) an m-bit digital-to-analog converter having an LSB current switch;
    (b) means for applying a most significant m bits of an n-bit digital signal to be converted, to m bits, respectively, of the m-bit digital-to-analog converter, successive values of the n-bit digital signal being substituted at a first frequency;
    (c) interpolation circuit means for producing an interpolation signal having the first frequency;
    (d) means for applying a least significant n−m bits of the n-bit digital signal to the interpolation circuit means to cause the interpolation circuit means to interpolate between successive values of the n-bit digital signal;
    (e) an LSB current switch circuit means distinct from the m-bit digital-to-analog converter, for producing an output signal in response to the interpolation signal; and
    (f) means for combining an analog output signal produced by the m-bit digital-to-analog converter with the output signal produced by the LSB current switch circuit means to produce an analog output signal with n-bit resolution.

5. The digital-to-analog conversion device of claim 4 wherein the interpolation circuit means includes an up/down counter and means for applying the least significant n−m bits to inputs of the n−m bit up/down counter and means for operating the up/down counter to count up or down from the digital value of the least significant n−m bits at a second frequency that is $2^{n-m}$ times the first frequency to thereby produce the interpolation signal on a carry output of the up/down counter, to thereby limit settling times of the analog output signal occurring at the first frequency to the settling times of the output signal of the LSB current switch.

* * * * *